(12) United States Patent
Fukuhara

(10) Patent No.: US 6,269,031 B1
(45) Date of Patent: Jul. 31, 2001

(54) SEMICONDUCTOR MEMORY DEVICE

(75) Inventor: Hayuru Fukuhara, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/619,644

(22) Filed: Jul. 19, 2000

(30) Foreign Application Priority Data

Jul. 19, 1999 (JP) .................................................. 11-204811

(51) Int. Cl.[7] ...................................................... G11C 7/00
(52) U.S. Cl. ...................... 365/194; 365/201; 365/230.06
(58) Field of Search .................................. 365/194, 201, 365/230.06, 189.05, 189.08, 63

(56) References Cited

U.S. PATENT DOCUMENTS 6,088,281 * 7/2000 Miyakawa et al. ............... 365/225.7

* cited by examiner

Primary Examiner—David Nelms
Assistant Examiner—Thong Le
(74) Attorney, Agent, or Firm—Young & Thompson

(57) ABSTRACT

The present invention provides a semiconductor memory device comprising: a control signal generator circuit for generating a set signal; a delay circuit connected to the control signal generator circuit for receiving the set signal and delaying the set signal with a predetermined delay time to generate a reset signal; a set/reset latch circuit connected to the delay circuit and the control signal generator circuit for receiving the reset signal and the set signal to generate a column address selecting control signal on the basis of the reset signal and the set signal; a column address decoder circuit connected to the set/reset latch circuit for receiving the column address selecting control signal to generate a column address selecting signal with a pulse width depending on the column address selecting control signal; and a memory cell array connected to the column address decoder circuit for receiving the column address selecting signal to execute a data transfer operation within a rise-time period of the column address selecting signal, wherein the delay circuit is capable of varying the delay time of the reset signal.

11 Claims, 5 Drawing Sheets

9 : delay by delay circuit 9
10 : delay by variable delay circuit 10

SEMICONDUCTOR MEMORY DEVICE

BACKGROUND OF THE INVENTION

The present invention relates to a semiconductor device, and more particularly to a semiconductor memory device which generates a column address selecting signal and transfers data within a rise time period of the generated column address selecting signal.

The semiconductor memory device such as the random access memory generates a column address selecting signal on the basis of internal clock frequency, so that within a rise time period of the generated column address selecting signal, a data transfer is made between the semiconductor memory device and a host device such as CPU through a digit line selected by the generated column address selecting signal.

The rise time period of the generated column address selecting signal depends upon a pulse width of the column address selecting signal. The rise time period of the column address selecting signal will hereinafter be referred to as an active width.

In recent years, as the high speed performance of the CPU has been on the improvement, it has been on the requirement for increasing the operating frequency of the semiconductor memory device. If the semiconductor memory device operates depending upon a frequency of a clock signal, then it is possible that an operational margin of the active width of the column address selecting signal is made narrow.

The advanced semiconductor memory device takes another operational system such that the advanced semiconductor memory device operates so that the active width of the column address selecting signal is fixed independent from the frequency of the clock.

If, however, the advanced semiconductor memory device operates so that the active width of the high frequency column address selecting signal is fixed independent from the frequency of the clock, then it is possible in case that all of chips provided internally operate in the active width of the high frequency column address selecting signal, whereby it is possible that chips are defective which have been inoperable in the high frequency column address selecting signal for selection or evaluation on the chips.

In the above circumstances, it had been required to develop a novel semiconductor memory device free from the above problem.

SUMMARY OF THE INVENTION

Accordingly, it is an object of the present invention to provide a novel semiconductor memory device free from the above problems.

It is a further object of the present invention to provide a novel semiconductor memory device operable in an appropriate active width of a column address selecting signal without any defective operation of all of internally provided chips.

The present invention provides a semiconductor memory device comprising: a control signal generator circuit for generating a set signal; a delay circuit connected to the control signal generator circuit for receiving the set signal and delaying the set signal with a predetermined delay time to generate a reset signal; a set/reset latch circuit connected to the delay circuit and the control signal generator circuit for receiving the reset signal and the set signal to generate a column address selecting control signal on the basis of the reset signal and the set signal; a column address decoder circuit connected to the set/reset latch circuit for receiving the column address selecting control signal to generate a column address selecting signal with a pulse width depending on the column address selecting control signal; and a memory cell array connected to the column address decoder circuit for receiving the column address selecting signal to execute a data transfer operation within a rise-time period of the column address selecting signal, wherein the delay circuit is capable of varying the delay time of the reset signal.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
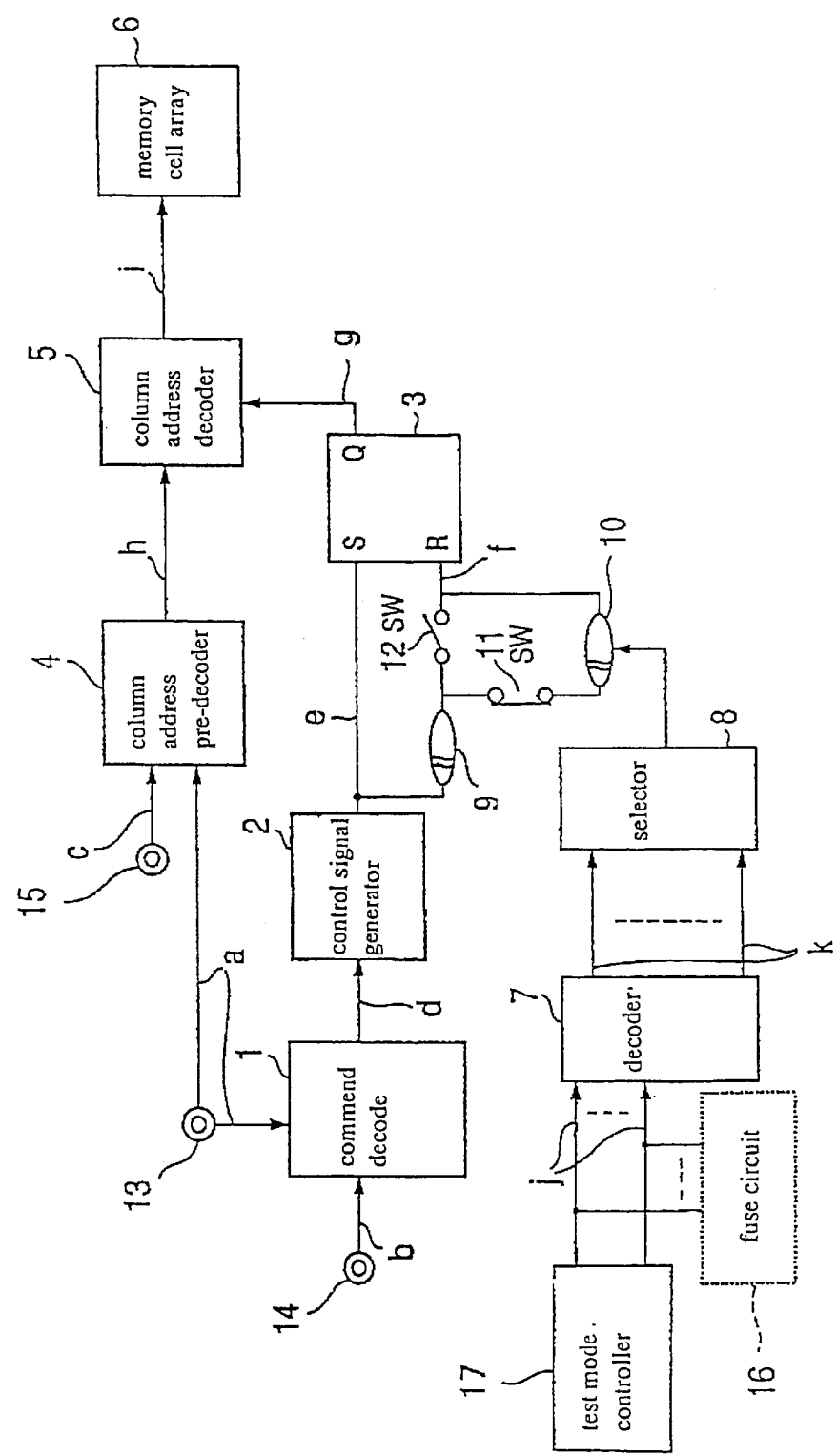
FIG. 1 is a block diagram illustrative of a circuit configuration of a novel semiconductor memory device in a first embodiment in accordance with the present invention.

The present invention provides a semiconductor memory device comprising: a control signal generator circuit for generating a set signal; a delay circuit connected to the control signal generator circuit for receiving the set signal and delaying the set signal with a predetermined delay time to generate a reset signal; a set/reset latch circuit connected to the delay circuit and the control signal generator circuit for receiving the reset signal and the set signal to generate a column address selecting control signal on the basis of the reset signal and the set signal; a column address decoder circuit connected to the set/reset latch circuit for receiving the column address selecting control signal to generate a column address selecting signal with a pulse width depending on the column address selecting control signal; and a memory cell array connected to the column address decoder circuit for receiving the column address selecting signal to execute a data transfer operation within a rise-time period of the column address selecting signal, wherein the delay circuit is capable of varying the delay time of the reset signal.

It is possible to further comprise: a fuse circuit generating test mode signals; a decoder circuit connected to the fuse circuit for receiving the test mode signals to decode the test mode signals and generate delay value selecting signals; and a selector connected to the decoder circuit and also the delay circuit for receiving the delay value selecting signals to select one of the delay value selecting signals and transmit the selected one of the delay value selecting signals to the delay circuit, so that the delay circuit varies the delay time of the reset signal on the basis of the selected one of the delay value selecting signals.

It is possible to further comprise: a test mode control circuit connected to the decoder circuit generating plural kinds of a test mode signal in the test mode, wherein in the test mode, the decoder circuit receives the plural kinds of the test mode signal to decode the plural kinds of the test mode signal to generate plural kinds of the delay value selecting signals, in the test mode, the selector selects one of the plural kinds of the delay value selecting signals; in the test mode, the delay circuit generates the reset signal on the basis of the selected one of the plural kinds of the delay value selecting signals; in the test mode, the set/reset latch circuit generates the column address selecting control signal on the basis of the reset signal and the set signal; in the test mode, the address decoder circuit generates the column address selecting signal on the basis of the column address selecting control signal; and in the test mode, the memory cell array executes the data transfer operation within the rise-time period of the column address selecting signal.

It is possible that the fuse circuit generates, in a normal mode, the test mode signal on the basis of a result of the data transfer of the memory cell array in the test mode.

It is possible that the delay circuit comprises a series connection of a non-variable delay circuit for providing a constant delay time and a variable delay circuit for providing a variable delay time, and the variable delay circuit is connected between the non-variable delay circuit and the set/reset latch circuit through a switching device so that the switching device switches the variable delay circuit to be operable and inoperable states.

It is further possible that the variable delay circuit further comprises: first and signal sources for generating first and second signals; a first inverter which has an input signal receiving the set signal; a first transistor which has a gate connected to the second signal source for receiving the second signal from the second signal source and the first transistor being connected in series between an output terminal of the first inverter and a first capacitor connected in series between the first transistor and a ground line; a second transistor being provided which has a gate connected to the first signal source for receiving the first signal, and the second transistor being connected in series between an output terminal of the second inverter and a second capacitor connected in series between the second transistor and a ground line; and a second inverter which has an input terminal connected to the output terminal of the first inverter and also connected to the first and second transistors and which has an output terminal, from which the reset signal is outputted.

It is also possible that the variable delay circuit further comprises: first and second current sources for supplying first and second currents; a first transistor which has a drain connected to the first current source, a source connected to a high voltage line and a gate connected to the drain; an eighth transistor which has a source connected to the second current source, a drain connected to a ground line and a gate connected to the source; a fourth transistor which has a gate receiving the set signal; a sixth transistor which has a gate receiving the set signal, a source connected to a drain of the fourth transistor; a fifth transistor which has a gate connected to a drain of the fourth transistor and the source of the sixth transistor; a seventh transistor which has a gate connected to the drain of the fourth transistor and the source of the sixth transistor, and a source connected to a source of the fifth transistor; a second transistor which has a drain connected to a source of the fourth transistor, a source connected to the high voltage line and a gate connected to the gate of the first transistor; a ninth transistor which has a drain connected to the ground line, a source connected to the drain of the sixth transistor and a gate connected to the gate of the eighth transistor; a third transistor which has a drain connected to the source of the fifth transistor, a source connected to the high voltage line and a gate connected to the gate of the second transistor; and a tenth transistor which has a drain connected to the ground line, a source connected to the drain of the seventh transistor and a gate connected to the gate of the ninth transistor, so that the reset signal is outputted from an output terminal connected to the drain of the fifth transistor and the source of the seventh transistor.

It is also possible that the variable delay circuit further comprises: a first circuit unit which receives the set signal; and a second circuit unit which is connected to an output side of the first circuit unit for outputting the reset signal.

It is further possible that the second circuit unit furthermore comprises a series connection of a plurality of a sub-unit which has logic gates.

It is also possible that the first circuit unit further more comprises: a first NAND gate which has a first input receiving the set signal and a second input connected to a signal source for receiving a signal from the signal source; a second NAND gate which has a first input connected to the high voltage line and a second input connected to an output of the first NAND gate; and a first inverter which has an input connected to an output of the second NAND gate.

It is also possible that each of the sub-unit further more comprises: a first NAND gate which has a first input receiving an output from a previous stage one of the sub-units and a second input connected to a signal source for receiving a signal from the signal source; a second NAND gate which has a first input connected to the high voltage line and a second input connected to an output of the first NAND gate; and a first inverter which has an input connected to an output of the second NAND gate.

In accordance with the novel semiconductor memory device of the present invention, the delay circuit delays the set signal with one of plural delay times, which corresponds to the kind of the test mode to enable the column address decoder circuit to generate selected one of the different column address selecting signals, which accords to the selected delay time, so that data transfer operations of the memory cell array in the test mode are evaluated by the plural kinds of the column address selecting signals, thereby selecting an optimum one of he column address selecting signals on the basis of the evaluation results.

The variable delay circuit is optionally made effective or operable in the normal mode so that even if part of the internally provided chips is made defective or inoperable, then it is possible to re-set the column address selecting signal.

PREFERRED EMBODIMENT

A first embodiment according to the present invention will be described in detail with reference to the drawings. FIG. 1 is a block diagram illustrative of a circuit configuration of a novel semiconductor memory device in a first embodiment in accordance with the present invention.

The novel semiconductor memory device has the following circuit elements. A fuse circuit 16 is provided for outputting a test mode signal "j" which accords to switching operations of the fuse in accordance with an enable signal in normal operation. A test mode control circuit 17 is provided for outputting plural kinds of test mode signals "j" in accordance with the test mode. A decoder 7 is provided which is connected to the fuse circuit 16 and the test mode control circuit 17 for receiving the test mode signals "j" from either the fuse circuit 16 and the test mode control circuit 17 to decode the test mode signals "j" thereby outputting delay value selecting signals "k". A selector 8 is provided which is connected to the decoder 7 for receiving the delay value selecting signals "k" to select one of the delay value selecting signals "k" thereby outputting a selected one of the delay value selecting signals "k". A clock pin 13 is provided for receiving a clock signal "a". A commend pin 14 is provided for receiving a commend signal "b". A commend decoder circuit 1 is provided which is connected to the clock pin 13 and the commend pin 14 for receiving the clock signal "a" and the commend signal "b", so that the commend signal "b" is inputted into the commend decoder circuit 1 at a rise-timing of the pulse of the clock signal "a", whereby the commend decoder circuit 1 decodes the inputted commend signal "b" to generate an internal clock signal "d". A control signal generator circuit 2 is provided which is connected to the commend decoder circuit 1 for receiving the internal clock signal "d" from the commend decoder circuit 1 so that the control signal generator circuit 2 generates a control signal on the basis of the internal clock signal "d" to output the control signal as a set signal "e". A delay circuit 9 is provided which is connected to the control signal generator circuit 2 for receiving the set signal "e" from the control signal generator circuit 2 to output the set signal "e" with a predetermined delay. A first switch SW11 is provided which is connected to the delay circuit 9. A second switch SW12 is also provided which is connected to the delay circuit 9 in parallel to the first switch SW11. A variable delay circuit 10 is provided which is connected in series through the first switch SW11 to the delay circuit 9 for receiving the set signal "e" with the predetermined delay if the first switch SW11 is closed whilst the second switch SW12 is opened. The variable delay circuit 10 is further connected to the selector 8 for receiving the delay value selecting signals "k", for delaying the set signal "e" with the above predetermined delay and a further delay based upon the delay value selecting signals "k", thereby outputting the set signal "e" with the above predetermined delay and the further delay as a reset signal "f". A set/reset latch circuit 3 is provided which is connected to the control signal generator circuit 2 for receiving the sct signal "e" from the control signal generator circuit 2. The set/reset latch circuit 3 is also connected through the second switch SW12 to the delay circuit 9 for receiving the set signal "e" with the predetermined delay from the delay circuit 9 if the first switch SW11 is opened whilst the second switch SW12 is closed. The set/resect latch circuit 3 is also connected to the variable delay circuit 10 for receiving the reset signal "f" from the variable delay circuit 10 if the first switch SW11 is closed whilst the second switch SW12 is opened. The set/reset latch circuit 3 generates a column address selecting control signal "g" on the basis of the set signal "e" and the reset signal "f". An address pin 15 is provided for receiving an address signal "c". A column address pre-decoder circuit 4 is provided which is connected to the address pin 15 for receiving the address signal "c" and also connected to the clock pin 13 for receiving the clock signal "a", so that the address signal "c" is inputted into the column address pre-decoder circuit 4 at a rise-timing of the pulse of the clock signal "a", whereby the column address pre-decoder circuit 4 decodes the address signal "c" to generate a column address pre-decoded signal "h". A column address decoder circuit 5 is provided which is connected to the column address pre-decoder circuit 4 for receiving the column address pre-decoded signal "h" from the column address pre-decoder circuit 4. The column address decoder circuit 5 is also connected to the set/reset latch circuit 3 for receiving the column address selecting control signal "g" from the set/reset latch circuit 3. The column address decoder circuit 5 generates a column address selecting signal "i" on the basis of the column address pre-decoded signal "h" and the column address selecting control signal "g". A memory cell array 6 is provided which is connected to the column address decoder circuit 5 for receiving the column address selecting signal "i" from the column address decoder circuit 5, so that the memory cell array 6 executes data transfers through a digit line selected by the column address selecting signal "i" within a rise-time period of the column address selecting signal "i".

Data transfer operations of the above novel semiconductor memory device will subsequently be described.

A data transfer operation in the test mode will be described. The test mode control circuit 17 generates plural kinds of the test mode signals "j" without operation of the fuse circuit 16. The plural kinds of the test mode signals "j" are transmitted to the decoder 7, so that the decoder 7 decodes the test mode signals "j" thereby outputting plural kinds of the delay value selecting signals "k". The selector 8 receives plural kinds of the delay value selecting signals "k" to select one kind of the delay value selecting signals "k" thereby outputting a selected one of the delay value selecting signals "k". She selected one of the delay value selecting signals "k" is transmitted to the variable delay circuit 10. At this time, the first switch SW11 is closed whilst the second switch SW12 is opened. Namely, the variable delay circuit 10 is connected between the delay circuit 9 and the set/reset latch circuit 3. The commend signal "b" is inputted into the commend decoder circuit 1 at the rise-timing of the pulse of the clock signal "a", whereby the commend decoder circuit 1 decodes the inputted commend signal "b" to generate the internal clock signal "d". The control signal generator circuit 2 receives the internal clock signal "d" from the commend decoder circuit 1 so that the control signal generator circuit 2 generates the control signal on the basis of the internal clock signal "d" to output the control signal as the set signal "e". The delay circuit 9 receives the set signal "e" from the control signal generator circuit 2 to output the set signal "e" with a predetermined delay which is fixed or constant. The variable delay circuit 10 receives the set signal "e" with the predetermined delay from the delay circuit 9 and also receives the selected one of the delay value selecting signals "k" from the selector 8, so that the variable delay circuit 10 further delays the set signal "e" with the above predetermined delay and a further delay based upon the selected one of the delay value selecting signals "k", thereby outputting the set signal "e" with the above predetermined delay and the further delay as the reset signal "f". The set/reset latch circuit 3 receives the set signal "e" from the control signal generator circuit 2, and also receives either the set signal "e" with the predetermined delay from the delay circuit 9 or the reset signal "f" from the variable delay circuit 10, so that the set/reset latch circuit 3 generates the column address selecting control signal "g" on the basis of the set signal "e" and the reset signal "f". The column address pre-decoder circuit 4 receives the address signal "c" at a rise-timing of the pulse of the clock signal "a", whereby the column address pre-decoder circuit 4 decodes the address signal "c" to generate the column address pre-decoded signal "h". The column address decoder circuit 5 receives the column address pre-decoded signal "h" from the column address pre-decoder circuit 4, and also receives the column address selecting control signal "g" from the set/reset latch circuit 3, so that the column address decoder circuit 5 generates the column address selecting signal "i" on the basis of the column address pre-decoded signal "h" and the column address selecting control signal "g". The memory cell array 6 receives the column address selecting signal "i" from the column address decoder circuit 5, so that the memory cell array 6 executes data transfers through a digit line selected by the column address selecting signal "i" within a rise-time period of the column address selecting signal "i". The data transfer is made between the memory cell array 6 and a host device not illustrated such as CPU.

The rise-time period of the column address selecting signal "i" depends upon a pulse width of the column address selecting signal "i". The rise-time period of the column address selecting signal "i" will hereinafter referred to as an active width.

The kind of the delay value selecting signal "k" to be supplied to the variable delay circuit 10 depends upon the selection by the selector 8, for which reason the variable delay circuit 10 provides plural delay values to the set signal "e" in accordance with the plural test modes, whereby the variable delay circuit 10 is capable of generating plural kinds of the reset signal "f". As a result, the set/reset latch circuit 3 generates plural kinds of the column address selecting control signal "g". The column address decoder circuit 5 generates plural kinds of the column address selecting signal "i".

In the test mode, the data transfer is made in different active widths of plural kinds the column address selecting signals "i".

The fuse circuit 16 shows switching operations of the fuse on the basis of the result of the data transfer in the above test mode of the memory cell array 6 so as to optimize the active width of the column address selecting signal "i", whereby test mode signals "j" in accordance with the switching operation of the fuse are generated by the enable signal. The test mode signals "j" are transmitted to the decoder 7, so that the decoder 7 decodes the test mode signals "j" thereby outputting plural kinds of the delay value selecting signals "k". The selector 8 receives plural kinds of the delay value selecting signals "k" to select one kind of the delay value selecting signals "k" thereby outputting a selected one of the delay value selecting signals "k". The selected one of the delay value selecting signals "k" is transmitted to the variable delay circuit 10. At this time, the first switch SW11 is closed whilst the second switch SW12 is opened. Namely, the variable delay circuit 10 is connected between the delay circuit 9 and the set/reset latch circuit 3. The commend signal "b" is inputted into the commend decoder circuit 1 at the rise-timing of the pulse of the clock signal "a", whereby the commend decoder circuit 1 decodes the inputted commend signal "b" to generate the internal clock signal "d". The control signal generator circuit 2 receives the internal clock signal "d" from the commend decoder circuit 1 so that the control signal generator circuit 2 generates the control signal on the basis of the internal clock signal "d" to output the control signal as the set signal "e". The delay circuit 9 receives the set signal "e" from the control signal generator circuit 2 to output the set signal "e" with a predetermined delay which is fixed or constant. The variable delay circuit 10 receives the set signal "e" with the predetermined delay from the delay circuit 9 and also receives the selected one of the delay value selecting signals "k" from the selector 8, so that the variable delay circuit 10 further delays the set signal "e" with the above predetermined delay and a further delay based upon the selected one of the delay value selecting signals "k", thereby outputting the set signal "e" with the above predetermined delay and the further delay as the reset signal "f". The set/reset latch circuit 3 receives the set signal "e" from the control signal generator circuit 2, and also receives either the set signal "e" with the predetermined delay from the delay circuit 9 or the reset signal "f" from the variable delay circuit 10, so that the set/reset latch circuit 3 generates the column address selecting control signal "g" on the basis of the set signal "c" and the reset signal "f". The column address pre-decoder circuit 4 receives the address signal "c" at a rise-timing of the pulse of the clock signal "a", whereby the column address pre-decoder circuit 4 decodes the address signal "c" to generate the column address pre-decoded signal "h". The column address decoder circuit 5 receives the column address predecoded signal "h" from the column address pre-decoder circuit 4, and also receives the column address selecting control signal "g" from the set/reset latch circuit 3, so that the column address decoder circuit 5 generates the column address selecting signal "i" on the basis of the column address pre-decoded signal "h" and the column address selecting control signal "g". The memory cell array 6 receives the column address selecting signal "i" from the column address decoder circuit 5, so that the memory cell array 6 executes data transfers through a digit line selected by the column address selecting signal "i" within a rise-time period of the column address selecting signal "i". The data transfer is made between the memory cell array 6 and a host device not illustrated such as CPU.

The rise-time period of the column address selecting signal "i" depends upon a pulse width of the column address selecting signal "i". The rise-time period of the column address selecting signal "i" will hereinafter referred to as an active width. The kind of the delay value selecting signal "k" to be supplied to the variable delay circuit 10 depends upon the selection by the selector 8, for which reason the variable delay circuit 10 provides plural delay values to the set signal "e" in accordance with the plural test modes, whereby the variable delay circuit 10 is capable of generating plural kinds of the reset signal "f". As a result, the set/reset latch circuit 3 generates plural kinds of the column address selecting control signal "g". The column address decoder circuit 5 generates plural kinds of the column address selecting signal "i".

As described above, the fuse circuit 16 shows switching operations of the fuse on the basis of the result of the data transfer in the above test mode of the memory cell array 6 so as to optimize the active width of the column address selecting signal "i", whereby test mode signals "j" in accordance with the switching operation of the fuse are generated by the enable signal. The test mode signals "j" arc transmitted to the decoder 7, so that the memory cell array 6 exceutes data transfers in the optimum active width of the column address selecting signal "i".

Even if some chips are made inoperable in evaluation thereof in the test mode, the fuse circuit 16 shows the above switching operation, so as to optimize the active width of the column address selecting signal "i" except in the test mode.

In the above descriptions, the variable delay circuit 10 is provided between the delay circuit 9 and the set/reset latch circuit 3, wherein the first switch SW11 is closed whilst the second switch SW12 is opened. It is, however, possible that depending upon the result of the operation of the memory cell array 6 in the test mode, the variable delay circuit 10 is made ineffective and only the delay circuit 9 delays the set signal "e" to generate the reset signal "f", wherein the first switch SW11 is opened whilst the second switch SW12 is closed.

Figure 2:
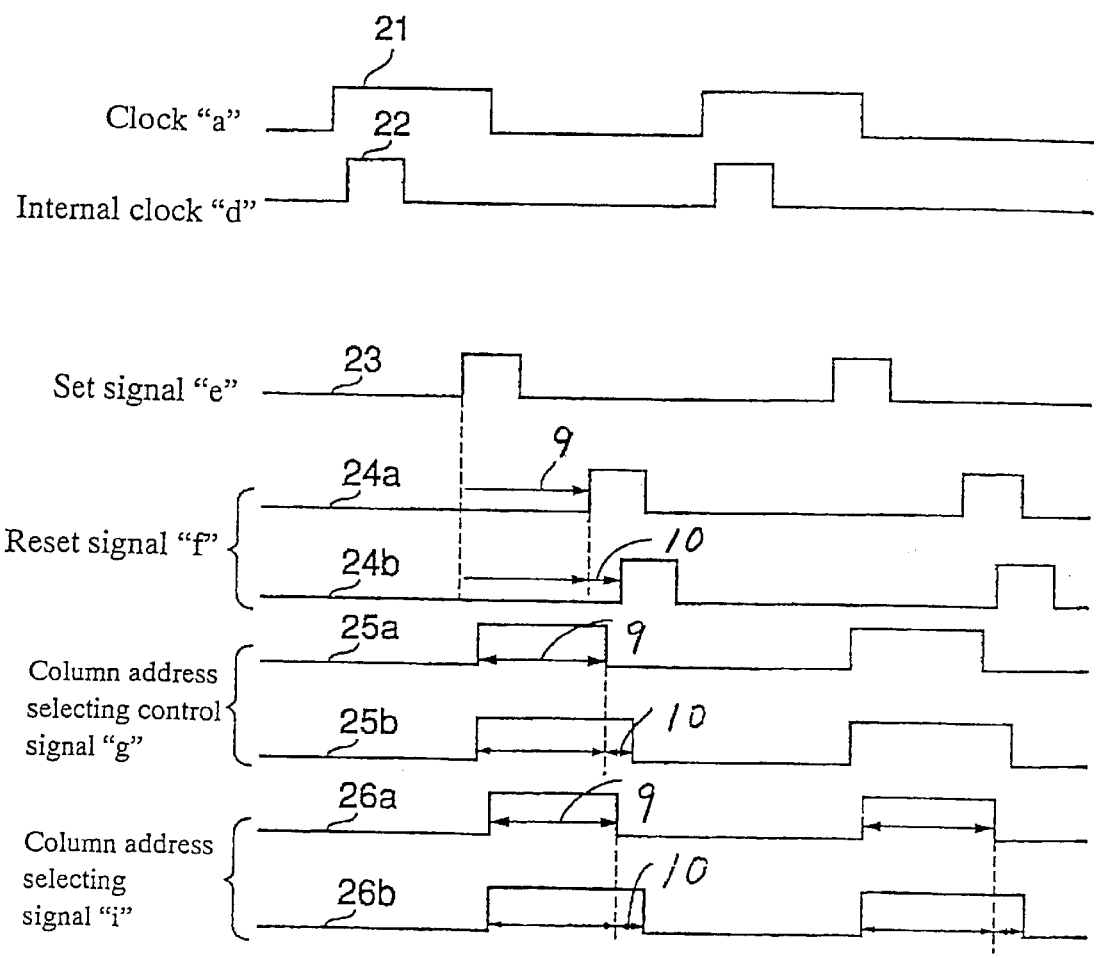
FIG. 2 is a diagram illustrative of waveforms of individual signals, for example, the clock signal "a", the internal clock signal "d", the set signal "e", the reset signal "f", the column address selecting control signal "g", and the column address selecting signal "i".

The data transfer operation of the above novel semiconductor memory device will be described in detail. FIG. 2 is a diagram illustrative of waveforms of individual signals, for example, the clock signal "a", the internal clock signal "d", the set signal "e", the reset signal "f", the column address selecting control signal "g", and the column address selecting signal "i". The clock signal "a" has a waveform 21. The internal clock signal "d" has a waveform 22. The set signal "e" has a waveform 23. If the variable delay circuit 10 is ineffective where the first switch SW11 is opened whilst the second switch SW12 is closed, then the reset signal "f" has a waveform 24a. If the variable delay circuit 10 is effective where the first switch SW11 is closed whilst the second switch SW12 is opened, then the reset signal "f" has a waveform 24b. If the variable delay circuit 10 is ineffective where the first switch SW11 is opened whilst the second switch SW12 is closed, then the column address selecting control signal "g" has a waveform 25a. If the variable delay circuit 10 is effective where the first switch SW11 is closed whilst the second switch SW12 is opened, then the column address selecting control signal "g" has a waveform 25b. If the variable delay circuit 10 is ineffective where the first switch SW11 is opened whilst the second switch SW12 is closed, then the column address selecting signal "i" has a waveform 26a. If the variable delay circuit 10 is effective where the first switch SW11 is closed whilst the second switch SW12 is opened, then the column address selecting signal "i" has a waveform 26b.

As shown in FIG. 2, the commend decoder circuit 1 generates the internal clock signal "d" of the waveform 22 at the rise-timing of the pulse of the clock signal "a" of the waveform 21. Thereafter, the control signal generator circuit 2 generates the set signal "e" of the waveform 23. If the set signal "e" is delayed by only the delay circuit 9, the reset signal "f" of the waveform 24a is generated. If the set signal "e" is delayed by both the delay circuit 9 and the variable delay circuit 10, the reset signal "f" of the waveform 24b is generated. If the variable delay circuit 10 is ineffective, then the set/reset latch circuit 3 generates the column address selecting control signal "g" of the waveform 25a. If the variable delay circuit 10 is effective, then the set/reset latch circuit 3 generates the column address selecting control signal "g" of the waveform 25b. The column address selecting control signal "g" depends upon the rise-timing of the set signal "e" and the reset signal "f". If the variable delay circuit 10 is effective, then the active width of the column address selecting control signal "g" is widen by the delay of the variable delay circuit 10. If the variable delay circuit 10 is ineffective, then the column address decoder circuit 5 generates the column address selecting signal "i" of the waveform 26a. If the variable delay circuit 10 is effective, then the column address decoder circuit 5 generates the column address selecting signal "i" of the waveform 26b. The active width of the column address selecting signal "i" generated by the column address decoder circuit 5 depends upon the active width of the column address selecting control signal "g" generated by the set/reset latch circuit 3. If the variable delay circuit 10 is effective, then the active width of the column address selecting signal "i" is widen by the delay of the variable delay circuit 10.

The active width of the column address selecting signal "i" is independent from the clock signal "a". The active width of the column address selecting signal "i" depends upon the delay by the delay circuit 9 and the variable delay circuit 10. Variation in delay of the variable delay circuit 10 varies the active width of the column address selecting signal "i".

Figure 3:
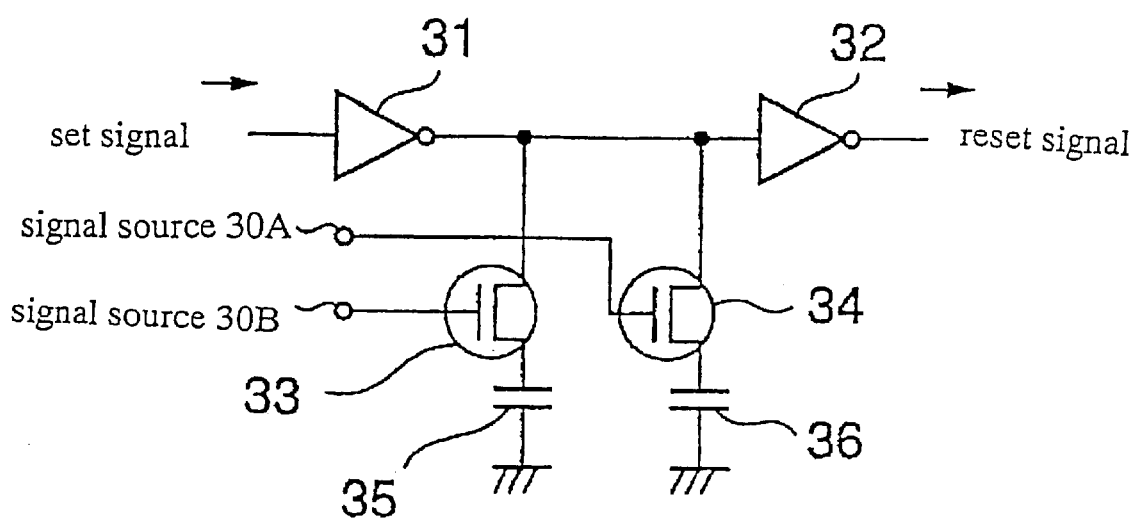
FIG. 3 is a circuit diagram illustrative of a circuit configuration of the variable delay circuit provided in the novel semiconductor memory device of FIG. 1.

FIG. 3 is a circuit diagram illustrative of a circuit configuration of the variable delay circuit provided in the novel semiconductor memory device of FIG. 1. The variable delay circuit 10 receives the set signal delayed by the delay circuit 9. The variable delay circuit 10 has the following circuit elements. A first signal source 30A is provided for generating a first signal. A second signal source 30B is provided for generating a second signal. A first inverter 31 is provided which has an input signal receiving the set signal. A first transistor 33 is provided which has a gate connected to the second signal source 30B for receiving the second signal from the second signal source 30B. The first transistor 33 is connected in series between an output terminal of the first inverter 31 and a first capacitor 35. The first capacitor 35 is connected in series between the first transistor 33 and a ground line. A second transistor 34 is provided which has a gate connected to the first signal source 30A for receiving the first signal from the first signal source 30A. The second transistor 34 is connected in series between an output terminal of the second inverter 32 and a second capacitor 36. The second capacitor 36 is connected in series between the second transistor 34 and a ground line. A second inverter 32 is provided which has an input terminal connected to the output terminal of the first inverter 31. The input terminal of the second inverter 32 also connected to the first and second transistors 33 and 34. The second inverter 32 has an output terminal, from which the reset signal is outputted. The selector 8 selects one of the first and second signal sources 30A and 30B, so that the delay of the variable delay circuit 10 depends on the capacity of the first or second capacitor 35 or 36. If the selector 8 selects the first signal source 30A, then the delay of the variable delay circuit 10 depends on the capacity of the second capacitor 36. If the selector 8 selects the second signal source 30B, then the delay of the variable delay circuit 10 depends on the capacity of the first capacitor 35.

Figure 4:
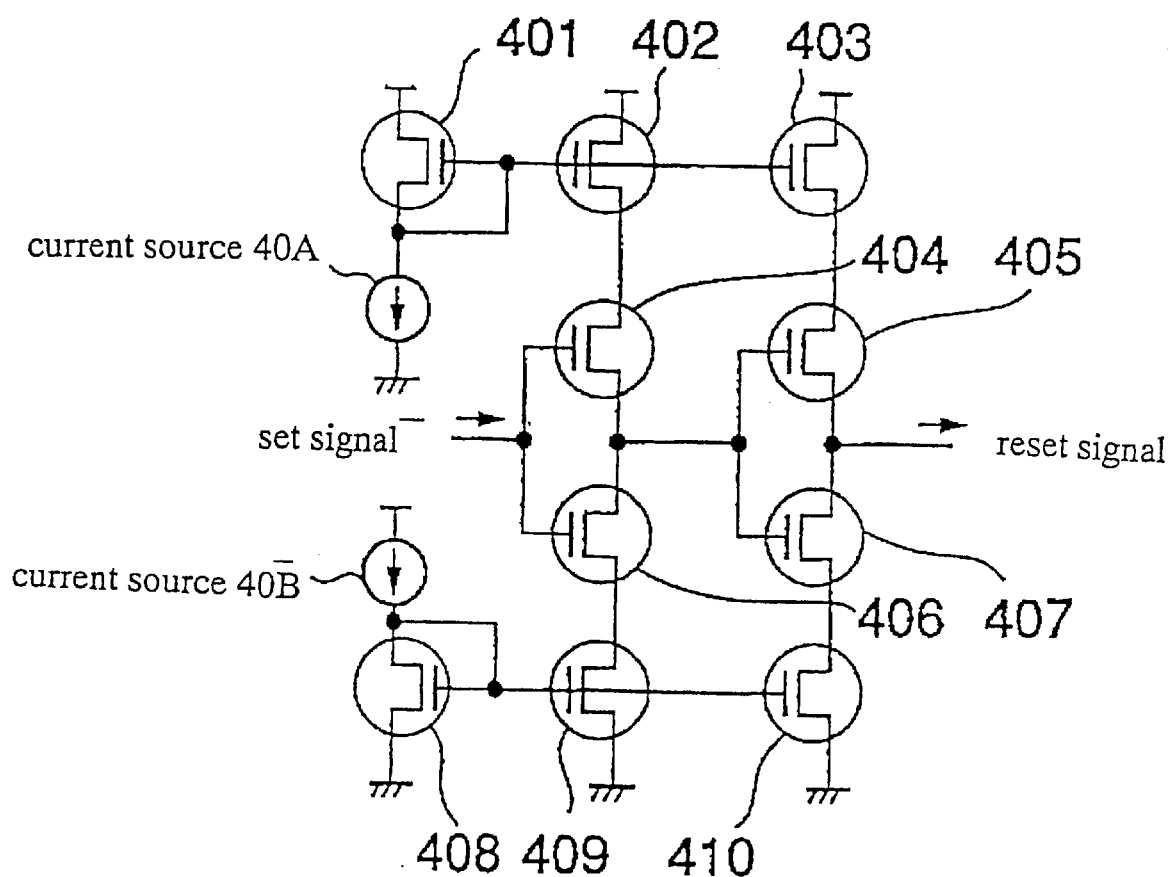
FIG. 4 is a circuit diagram illustrative of another circuit configuration of the variable delay circuit provided in the novel semiconductor memory device of FIG. 1.

FIG. 4 is a circuit diagram illustrative of another circuit configuration of the variable delay circuit provided in the novel semiconductor memory device of FIG. 1. The variable delay circuit 10 receives the set signal delayed by the delay circuit 9. The variable delay circuit 10 has the following circuit elements. A first current source 40A is provided for supplying a first current. The first current source 40A is connected to a ground line. A second current source 40B is provided for supplying a second current. The second current source 40B is connected to a high voltage line. A first transistor 401 is provided which has a drain connected to the first current source 40A, a source connected to the high voltage line and a gate connected to the drain, so that a short circuit is formed between the gate and drain of the first transistor 401. An eighth transistor 408 is provided which has a source connected to the second current source 40B, a drain connected to the ground line and a gate connected to the source, so that a short circuit is formed between the gate and source of the eighth transistor 408. A fourth transistor 404 is provided which has a gate receiving the set signal. A sixth transistor 406 is provided which has a gate receiving the set signal. A drain of the fourth transistor 404 is connected to a source of the sixth transistor 406. A fifth transistor 405 is provided which has a gate connected to the drain of the fourth transistor 404 and the source of the sixth transistor 406. A seventh transistor 407 is provided which has a gate connected to the drain of the fourth transistor 404 and the source of the sixth transistor 406. A source of the fifth transistor 405 is connected to a source of the seventh transistor 407. A second transistor 402 is provided which has a drain connected to a source of the fourth transistor 404, a source connected to the high voltage line and a gate connected to the gate of the first transistor 401. A ninth transistor 409 is provided which has a drain connected to the ground line, a source connected to the drain of the sixth transistor 406 and a gate connected to the gate of the eighth transistor 408. A third transistor 403 is provided which has a drain connected to the source of the fifth transistor 405, a source connected to the high voltage line and a gate connected to the gate of the second transistor 408. A tenth transistor 410 is provided which has a drain connected to the ground line, a source connected to the drain of the seventh transistor 407 and a gate connected to the gate of the ninth transistor 409. The reset signal is outputted from an output terminal connected to the drain of the fifth transistor 405 and the source of the seventh transistor 407.

The selector 408 selects one of the first and second current sources 40A and 40B, so that the delay of the variable delay circuit 10 depends on the characteristics of the first to tenth transistors 401 to 410.

Figure 5:
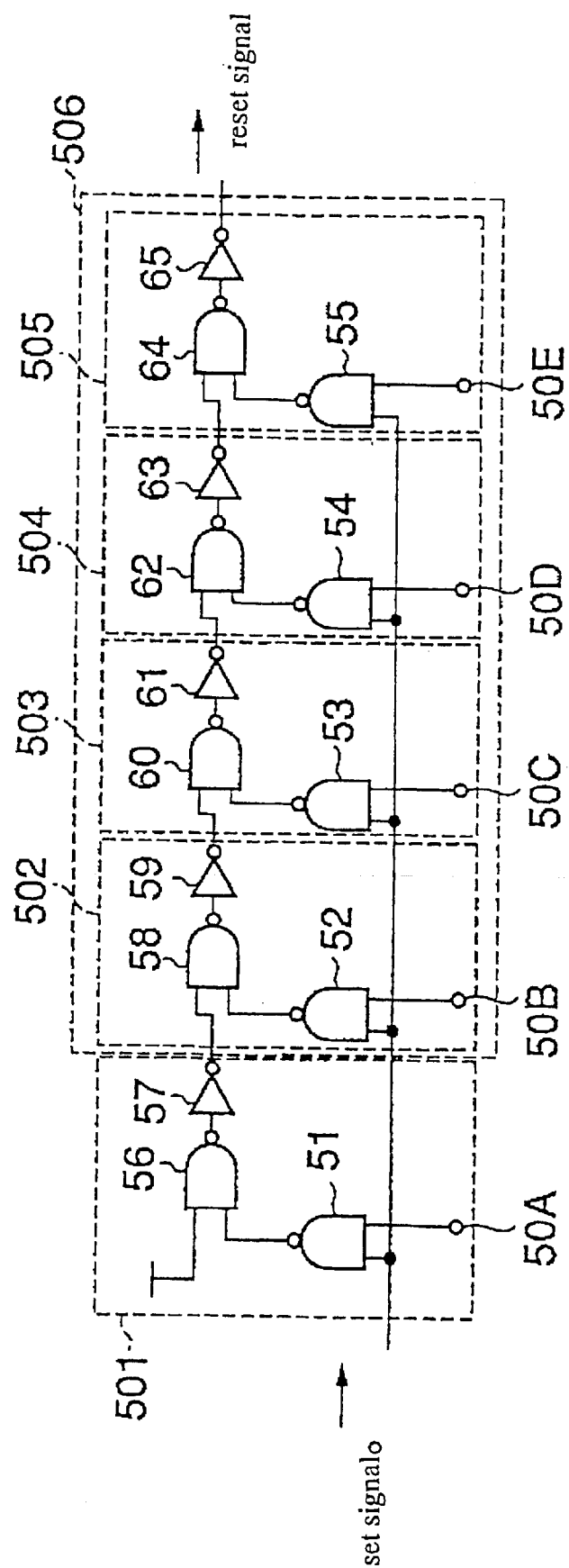
FIG. 5 is a circuit diagram illustrative of still another circuit configuration of the variable delay circuit provided in the novel semiconductor memory device of FIG. 1.

FIG. 5 is a circuit diagram illustrative of still another circuit configuration of the variable delay circuit provided in the novel semiconductor memory device of FIG. 1. The variable delay circuit 10 receives the set signal delayed by the delay circuit 9. The variable delay circuit 10 has the following circuit elements. A first circuit unit 501 is provided which receives the set signal. A second circuit unit 506 is provided which is connected to an output side of the first circuit unit 501 for outputting the reset signal. The second circuit unit 506 comprises a first sub-unit 502 connected to the output side of the first circuit unit 501, a second sub-unit 503 connected to the first sub-unit 502, a third sub-unit 504 connected to the second sub-unit 503, and a fourth sub-unit 505 connected to the third sub-unit 504.

The first circuit unit 501 has the following logic gates. A first NAND gate 51 is provided which has a first input receiving the set signal and a second input connected to a first signal source 50A for receiving a first signal from the first signal source 50A. A sixth NAND gate 56 is provided which has a first input connected to a high voltage line and a second input connected to an output of the first NAND gate 51. A first inverter 57 is also provided which has an input connected to an output of the sixth NAND gate 56. The first sub-unit 502 of the second circuit unit 506 has the following logic gates. A second NAND gate 52 is provided which has a first input receiving the set signal and a second input connected to a second signal source 50B for receiving a second signal from the second signal source 50B. A seventh NAND gate 58 is provided which has a first input connected to an output of the first inverter 57 and a second input connected to an output of the second NAND gate 52. A second inverter 59 is also provided which has an input connected to an output of the seventh NAND gate 58. The second sub-unit 503 of the second circuit unit 506 has the following logic gates. A third NAND gate 53 is provided which has a first input receiving the set signal and a second input connected to a third signal source 50C for receiving a third signal from the third signal source 50C. An eighth NAND gate 60 is provided which has a first input connected to an output of the second inverter 59 and a second input connected to an output of the third NAND gate 53. A third inverter 61 is also provided which has an input connected to an output of the eighth NAND gate 60. The third sub-unit 504 of the second circuit unit 506 has the following logic gates. A fourth NAND gate 54 is provided which has a first input receiving the set signal and a second input connected to a fourth signal source 50D for receiving a fourth signal from the fourth signal source 50D. A ninth NAND gate 62 is provided which has a first input connected to an output of the third inverter 61 and a second input connected to an output of the fourth NAND gate 54. A fourth inverter 63 is also provided which has an input connected to an output of the ninth NAND gate 62. The fourth sub-unit 505 of the second circuit unit 506 has the following logic gates. A fifth NAND gate 55 is provided which has a first input receiving the set signal and a second input connected to a fifth signal source 50E for receiving a fifth signal from the fifth signal source 50E. A tenth NAND gate 64 is provided which has a first input connected to an output of the fourth inverter 63 and a second input connected to an output of the fifth NAND gate 55. A fifth inverter 65 is also provided which has an input connected to an output of the tenth NAND gate 64. The reset signal is outputted from an output terminal of the fifth inverter 65.

The selector 8 selects one of the first to fifth signal sources 50A, 50B, 50C, 50D, and 50E, so that the delay of the variable delay circuit 10 depends on the necessary time for having the selected signal reach the fifth inverter 65.

In accordance with the novel semiconductor memory device of the present invention, the delay circuit delays the set signal with one of plural delay times, which corresponds to the kind of the test mode to enable the column address decoder circuit to generate selected one of the different column address selecting signals, which accords to the selected delay time, so that data transfer operations of the memory cell array in the test mode are evaluated by the plural kinds of the column address selecting signals, thereby selecting an optimum one of he column address selecting signals on the basis of the evaluation results.

The variable delay circuit is optionally made effective or operable in the normal mode so that even if part of the internally provided chips is made defective or inoperable, then it is possible to re-set the column address selecting signal.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor memory device comprising:
  a control signal generator circuit for generating a set signal;
  a delay circuit connected to said control signal generator circuit for receiving said set signal and delaying said set signal with a predetermined delay time to generate a reset signal;
  a set/reset latch circuit connected to said delay circuit and said control signal generator circuit for receiving said reset signal and said set signal to generate a column address selecting control signal on the basis of said reset signal and said set signal;
  a column address decoder circuit connected to said set/reset latch circuit for receiving said column address selecting control signal to generate a column address selecting signal with a pulse width depending on said column address selecting control signal; and a memory cell array connected to said column address decoder circuit for receiving said column address selecting signal to execute a data transfer operation within a rise-time period of said column address selecting signal, wherein said delay circuit is capable of varying said delay time of said reset signal.

2. The semiconductor memory device as claimed in claim 1, further comprising:

a fuse circuit generating test mode signals;

a decoder circuit connected to said fuse circuit for receiving said test mode signals to decode said test mode signals and generate delay value selecting signals; and a selector connected to said decoder circuit and also said delay circuit for receiving said delay value selecting signals to select one of said delay value selecting signals and transmit said selected one of said delay value selecting signals to said delay circuit, so that said delay circuit varies said delay time of said reset signal on the basis of said selected one of said delay value selecting signals.

3. The semiconductor memory device as claimed in claim 2, further comprising:

a test mode control circuit connected to the decoder circuit generating plural kinds of a test mode signal in the test mode, wherein in said test mode, said decoder circuit receives said plural kinds of said test mode signal to decode said plural kinds of said test mode signal to generate plural kinds of said delay value selecting signals, in said test mode, said selector selects one of said plural kinds of said delay value selecting signals;

in said test mode, said delay circuit generates said reset signal on the basis of said selected one of said plural kinds of said delay value selecting signals;

in said test mode, said set/reset latch circuit generates said column address selecting control signal on the basis of said reset signal and said set signal;

in said test mode, said address decoder circuit generates said column address selecting signal on the basis of said column address selecting control signal in said test mode, said memory cell array executes said data transfer operation within said rise-time period of said column address selecting signal.

4. The semiconductor memory device as claimed in claim 3, wherein said fuse circuit generates, in a normal mode, said test mode signal on the basis of a result of said data transfer of said memory cell array in said test mode.

5. The semiconductor memory device as claimed in claim 1, wherein said delay circuit comprises a series connection of a non-variable delay circuit for providing a constant delay time and a variable delay circuit for providing a variable delay time, and said variable delay circuit is connected between said non-variable delay circuit and said set/reset latch circuit through a switching device so that said switching device switches said variable delay circuit to he operable and inoperable states.

6. The semiconductor memory device as claimed in claim 5, wherein said variable delay circuit comprises:

first and signal sources for generating first and second signals;

a first inverter which has an input signal receiving said set signal;

a first transistor which has a gate connected to the second signal source for receiving the second signal from the second signal source and said first transistor being connected in series between an output terminal of the first inverter and a first capacitor connected in series between the first transistor and a ground line;

a second transistor being provided which has a gate connected to the first signal source for receiving the first signal, and said second transistor being connected in series between an output terminal of the second inverter and a second capacitor connected in series between the second transistor and a ground line; and a second inverter which has an input terminal connected to the output terminal of the first inverter and also connected to the first and second transistors and which has an output terminal, from which the reset signal is outputted.

7. The semiconductor memory device as claimed in claim 5, wherein said variable delay circuit comprises:

first and second current sources for supplying first and second currents;

a first transistor which has a drain connected to the first current source, a source connected to a high voltage line and a gate connected to the drain;

an eighth transistor which has a source connected to said second current source, a drain connected to a ground line and a gate connected to said source;

a fourth transistor which has a gate receiving the set signal;

a sixth transistor which has a gate receiving the set signal, a source connected to a drain of said fourth transistor;

a fifth transistor which has a gate connected to a drain of said fourth transistor and said source of said sixth transistor;

a seventh transistor which has a gate connected to said drain of said fourth transistor and said source of said sixth transistor, and a source connected to a source of said fifth transistor;

a second transistor which has a drain connected to a source of said fourth transistor, a source connected to said high voltage line and a gate connected to said gate of said first transistor;

a ninth transistor which has a drain connected to said ground line, a source connected to said drain of said sixth transistor and a gate connected to said gate of said eighth transistor;

a third transistor which has a drain connected to said source of said fifth transistor, a source connected to said high voltage line and a gate connected to said gate of said second transistor; and a tenth transistor which has a drain connected to said ground line, a source connected to said drain of said seventh transistor and a gate connected to said gate of said ninth transistor, so that said reset signal is outputted from an output terminal connected to said drain of said fifth transistor and said source of said seventh transistor.

8. The semiconductor memory device as claimed in claim 5, wherein said variable delay circuit comprises:

a first circuit unit which receives said set signal; and a second circuit unit which is connected to an output side of said first circuit unit for outputting said reset signal.

9. The semiconductor memory device as claimed in claim 8, wherein said second circuit unit further comprises a series connection of a plurality of a sub-unit which has logic gates.

10. The semiconductor memory device as claimed in claim 8, wherein said first circuit unit comprises:

a first NAND gate which has a first input receiving said set signal and a second input connected to a signal source for receiving a signal from said signal source;

a second NAND gate which has a first input connected to said high voltage line and a second input connected to an output of said first NAND gate; and a first inverter which has an input connected to an output of said second NAND gate.

11. The semiconductor memory device as claimed in claim 8, wherein each of said sub-unit comprises:

a first NAND gate which has a first input receiving an output from a previous stage one of said sub-units and a second input connected to a signal source for receiving a signal from said signal source;

a second NAND gate which has a first input connected to said high voltage line and a second input connected to an output of said first NAND gate; and a first inverter which has an input connected to an output of said second NAND gate.

* * * * *